(12) United States Patent
Yonehara et al.

(10) Patent No.: US 9,771,662 B2
(45) Date of Patent: Sep. 26, 2017

(54) HIGH-THROUGHPUT BATCH POROUS SILICON MANUFACTURING EQUIPMENT DESIGN AND PROCESSING METHODS

(71) Applicant: OB Realty, LLC, Irvine, CA (US)

(72) Inventors: Takao Yonehara, Sunnyvale, CA (US); Subramanian Tamilmani, San Jose, CA (US); Karl-Josef Kramer, San Jose, CA (US); Jay Ashjaee, Cupertino, CA (US); Mehrdad M. Moslehi, Los Altos, CA (US); Yasuyoshi Miyaji, Kyoto (JP); Noriyuki Hayashi, Kyoto (JP); Takamitsu Inahara, Uji (JP)

(73) Assignee: OB REALTY, LLC, Irvine, CA (US)

( * ) Notice: Subject to any disclaimer, the term of this patent is extended or adjusted under 35 U.S.C. 154(b) by 0 days.

(21) Appl. No.: 14/792,412

(22) Filed: Jul. 6, 2015

(65) Prior Publication Data

US 2016/0186358 A1 Jun. 30, 2016

Related U.S. Application Data

(63) Continuation of application No. 13/244,466, filed on Sep. 24, 2011, now Pat. No. 9,076,642, which is a
(Continued)

(51) Int. Cl.
*H01L 21/02* (2006.01)
*C25D 11/32* (2006.01)
*C25D 11/00* (2006.01)
*H01L 21/67* (2006.01)
*H01L 31/18* (2006.01)
(Continued)

(52) U.S. Cl.
CPC ............ *C25D 11/005* (2013.01); *C25D 11/32* (2013.01); *C25F 3/12* (2013.01); *H01L 21/0203* (2013.01); *H01L 21/67086* (2013.01); *H01L 21/68771* (2013.01); *H01L 21/68785* (2013.01); *H01L 31/1804* (2013.01); *Y02E 10/547* (2013.01); *Y02P 70/521* (2015.11)

(58) Field of Classification Search
CPC .... C25D 11/005; C25D 11/32; H01L 21/0203
See application file for complete search history.

(56) References Cited

U.S. PATENT DOCUMENTS 5,112,453 A 5/1992 Behr et al.
5,358,600 A 10/1994 Canham et al.
(Continued)

*Primary Examiner* — Bryan D. Ripa
(74) *Attorney, Agent, or Firm* — Howard IP Law Group, PC

(57) ABSTRACT

This disclosure enables high-productivity fabrication of porous semiconductor layers (made of single layer or multi-layer porous semiconductors such as porous silicon, comprising single porosity or multi-porosity layers). Some applications include fabrication of MEMS separation and sacrificial layers for die detachment and MEMS device fabrication, membrane formation and shallow trench isolation (STI) porous silicon (using porous silicon formation with an optimal porosity and its subsequent oxidation). Further, this disclosure is applicable to the general fields of photovoltaics, MEMS, including sensors and actuators, stand-alone, or integrated with integrated semiconductor microelectronics, semiconductor microelectronics chips and optoelectronics.

15 Claims, 9 Drawing Sheets

Related U.S. Application Data continuation-in-part of application No. 12/774,667, filed on May 5, 2010, now Pat. No. 8,999,058, which is a continuation-in-part of application No. 12/688,495, filed on Jan. 15, 2010, now Pat. No. 8,926,803.

(60) Provisional application No. 61/175,535, filed on May 5, 2009, provisional application No. 61/145,018, filed on Jan. 15, 2009, provisional application No. 61/386,318, filed on Sep. 24, 2010.

(51) Int. Cl.
*C25F 3/12* (2006.01)
*H01L 21/687* (2006.01)

(56) References Cited

U.S. PATENT DOCUMENTS

| | | | |
|---|---|---|---|
| 5,458,755 A * | 10/1995 | Fujiyama | C25D 5/022 204/224 R |
| 5,679,233 A | 10/1997 | Van Anglen et al. | |
| 5,689,603 A | 11/1997 | Huth | |
| 5,951,833 A | 9/1999 | Yamagata | |
| 6,197,654 B1 * | 3/2001 | Swanson | H01L 21/0203 205/106 |
| 6,235,147 B1 | 5/2001 | Lee et al. | |
| 6,254,759 B1 | 7/2001 | Rasmussen | |
| 6,258,244 B1 | 7/2001 | Ohmi et al. | |
| 6,331,208 B1 | 12/2001 | Nishida et al. | |
| 6,416,647 B1 | 7/2002 | Dordi et al. | |
| 6,517,697 B1 * | 2/2003 | Yamagata | C25D 11/32 134/26 |
| 6,551,908 B2 | 4/2003 | Ukiyo et al. | |
| 6,726,815 B1 | 4/2004 | Artmann et al. | |
| 6,818,104 B2 | 11/2004 | Iwasaki et al. | |
| 7,014,748 B2 | 3/2006 | Matsumura et al. | |
| 2002/0106874 A1 | 8/2002 | Iwane et al. | |
| 2003/0008473 A1 | 1/2003 | Sakaguchi et al. | |
| 2003/0121773 A1 | 7/2003 | Matsumura et al. | |
| 2004/0035532 A1 | 2/2004 | Jung et al. | |
| 2004/0217005 A1 | 11/2004 | Rosenfeld et al. | |
| 2004/0256238 A1 | 12/2004 | Suzuki et al. | |
| 2005/0092600 A1 | 5/2005 | Yoshioka et al. | |
| 2006/0105912 A1 | 5/2006 | Konle et al. | |
| 2006/0231031 A1 | 10/2006 | Dings et al. | |
| 2007/0187257 A1 | 8/2007 | Noji et al. | |
| 2008/0277885 A1 | 11/2008 | Duff et al. | |
| 2011/0120882 A1 | 5/2011 | Crafts et al. | |
| 2012/0138455 A1 | 6/2012 | Miyaji et al. | |
| 2013/0020206 A1 | 1/2013 | Wuebben et al. | |

\* cited by examiner

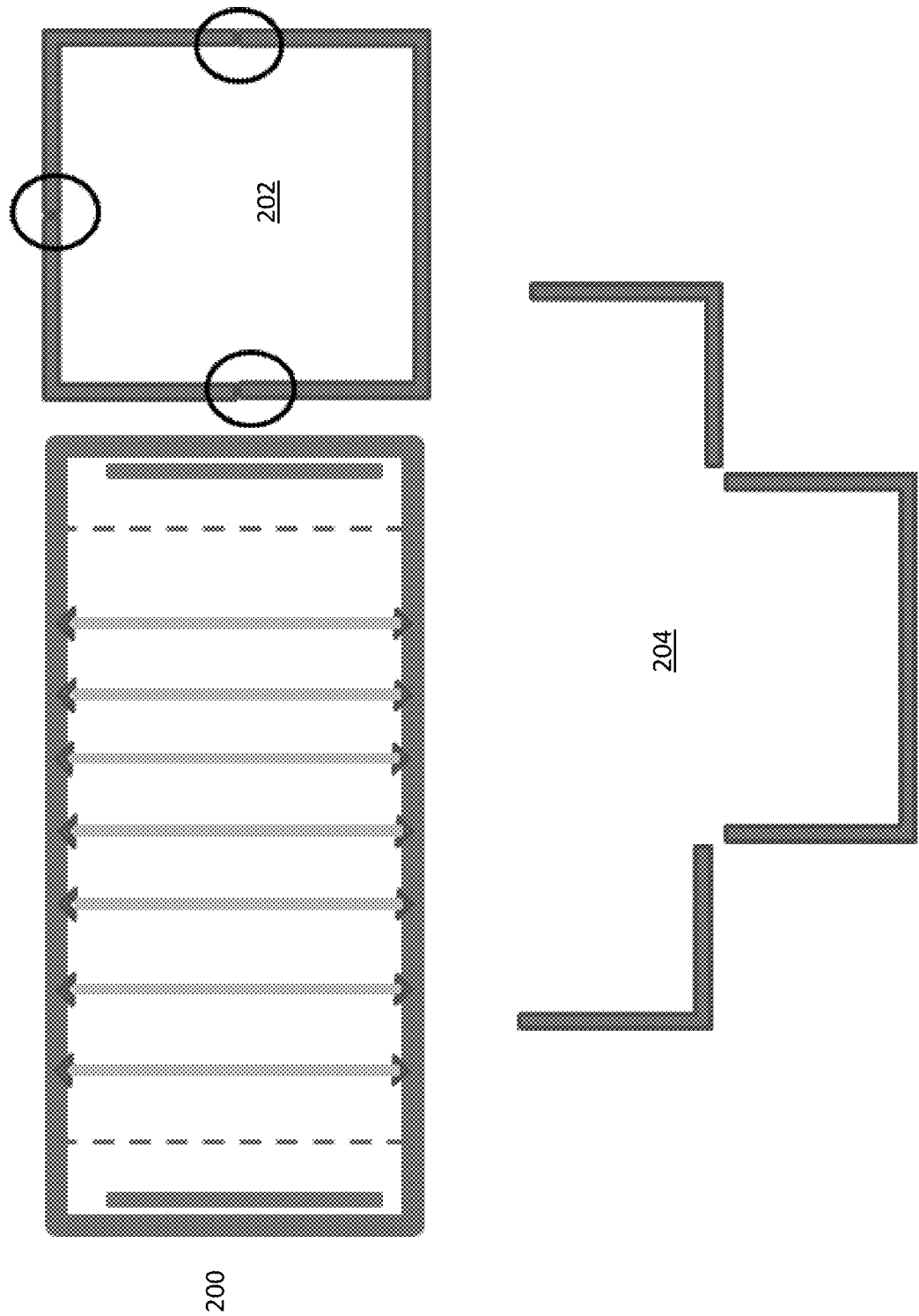

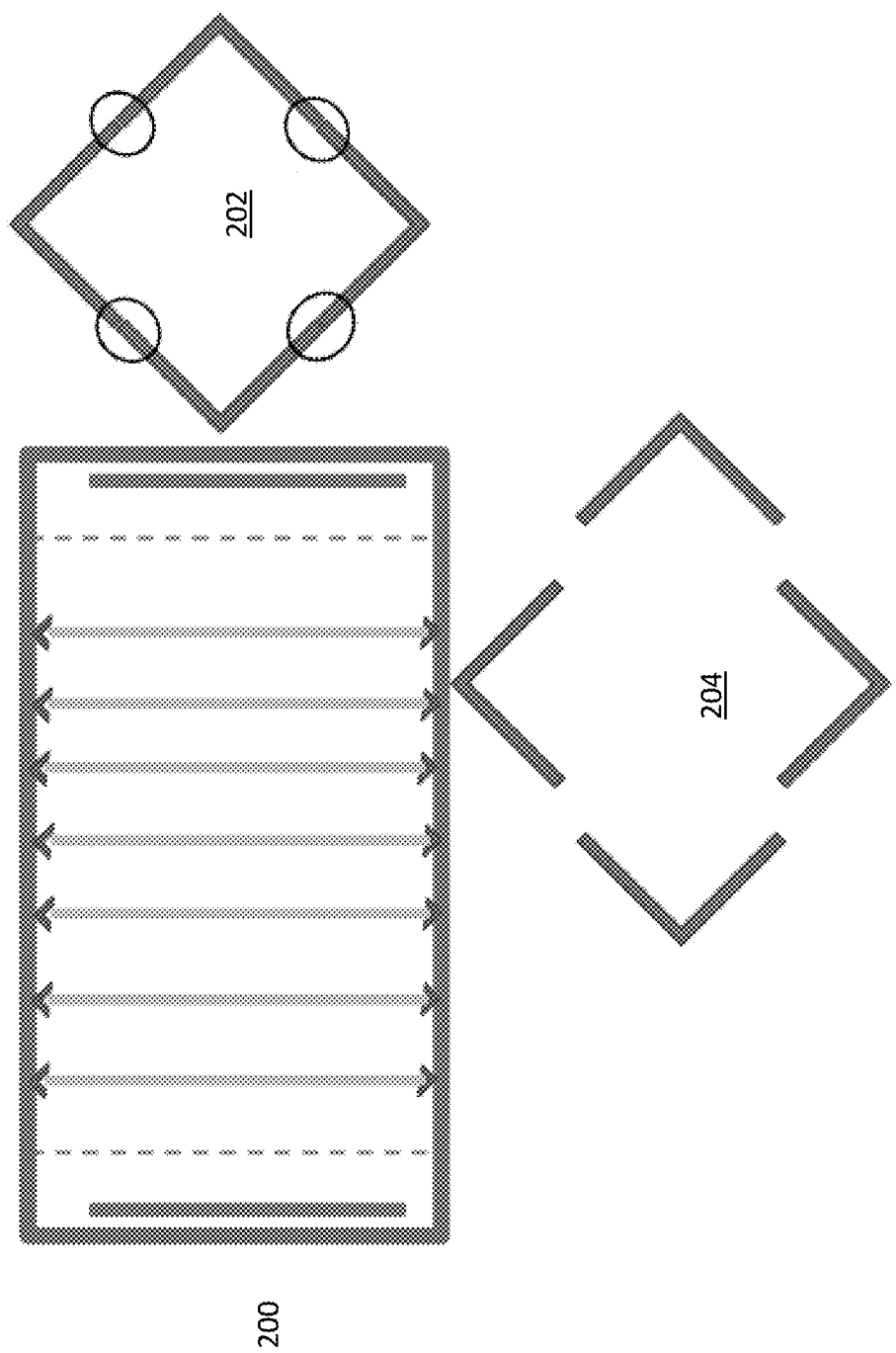

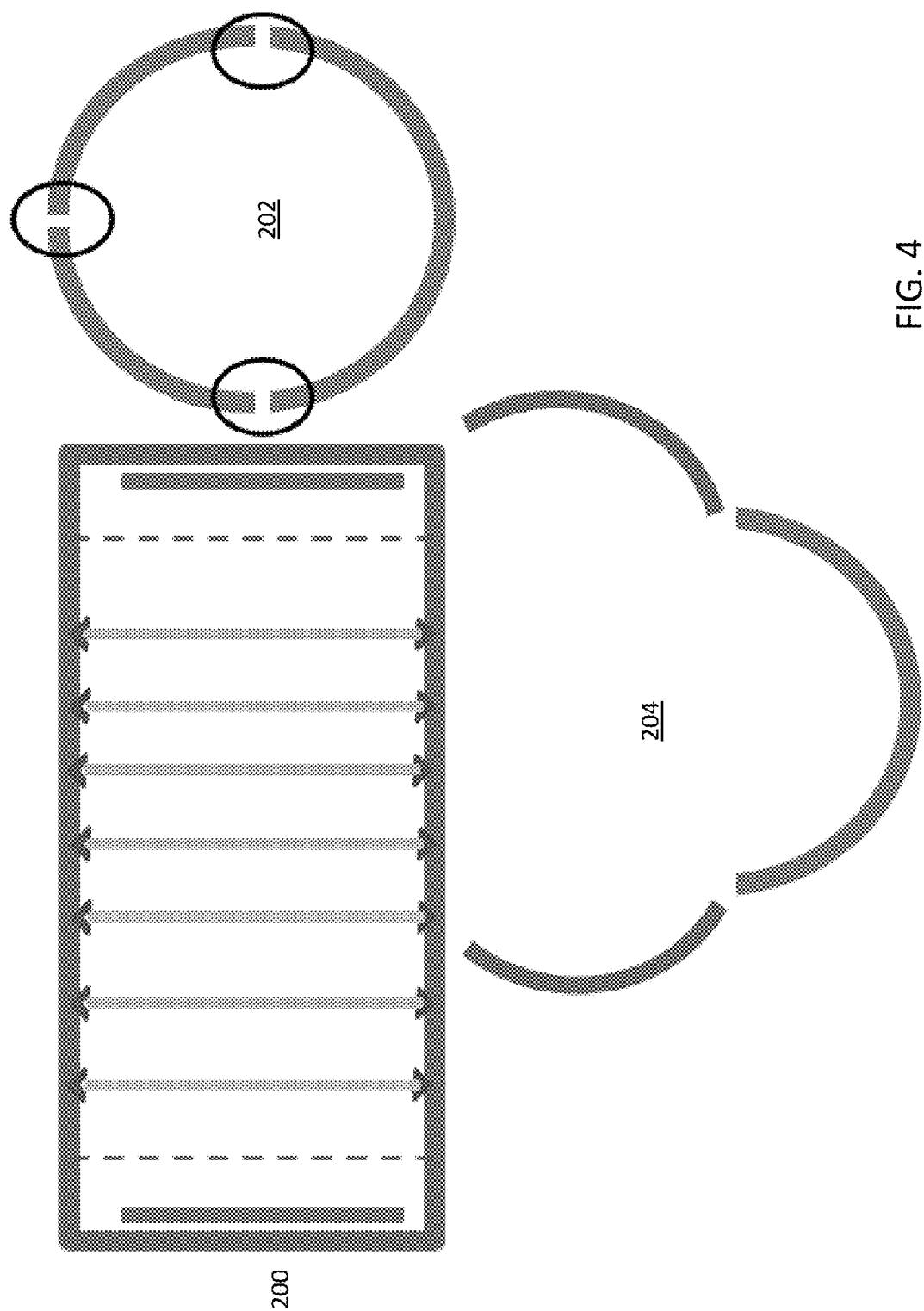

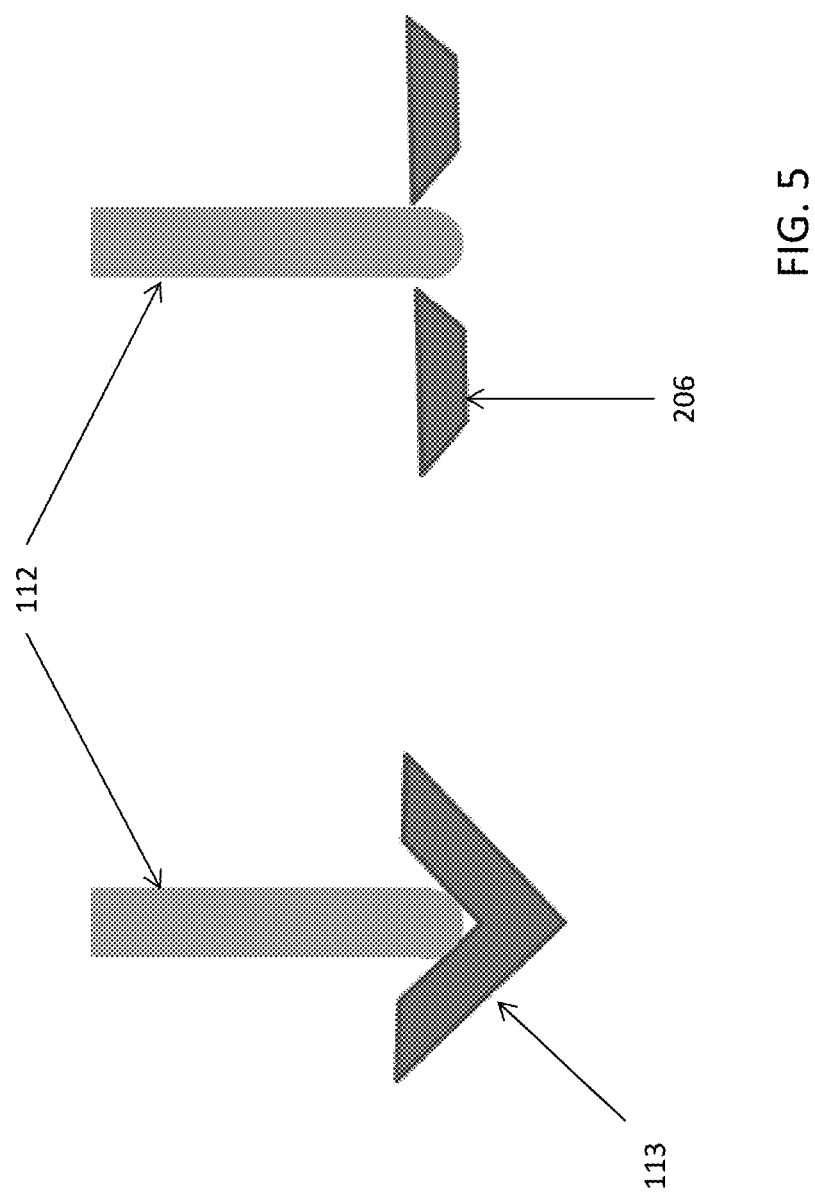

HIGH-THROUGHPUT BATCH POROUS SILICON MANUFACTURING EQUIPMENT DESIGN AND PROCESSING METHODS

CROSS-REFERENCE TO RELATED APPLICATIONS

This application is a continuation of U.S. patent application Ser. No. 13/244,466 filed Sep. 24, 2011 which claims priority to U.S. Prov. Pat. No. 61/386,318 filed Sep. 24, 2010, both of which are hereby incorporated by reference in their entirety. U.S. patent application Ser. No. 13/244,466 is also a continuation-in-part of U.S. patent application Ser. No. 12/688,495 filed Jan. 15, 2010 which claims priority to U.S. Prov. Pat. App. No. 61/145,018 filed Jan. 15, 2009 and a continuation-in-part of U.S. patent application Ser. No. 12/774,667 filed May 5, 2010 which claims priority to U.S. Prov. Pat. App. No. 61/175,535 filed May 5, 2009, all of which are hereby incorporated by reference in their entirety.

FIELD

The overall application fields of this disclosure cover many areas including but not limited to solar photovoltaics, semiconductor microelectronics, micro-electro-mechanical systems (MEMS), and optoelectronics. In the field of photovoltaics, this disclosure enables high-productivity fabrication of semiconductor-based sacrificial separation layers (made of porous semiconductors such as porous silicon), buried optical reflectors (made of multi-layer/multi-porosity porous semiconductors such as porous silicon), formation of porous semiconductor (such as porous silicon) for anti-reflection coatings, passivation layers, and multi-junction, multi-band gap solar cells (for instance, by forming a wider band gap porous silicon emitter on crystalline silicon thin film or wafer based solar cells). In the semiconductor field, it enables fabrication of sacrificial MEMS separation layers for die detachment, and shallow trench isolation (STI) porous silicon (using porous silicon formation with an optimal porosity and its subsequent oxidation). Other applications include the general fields of MEMS, including sensors and actuators, stand-alone, or integrated with integrated semiconductor microelectronics. Another range of applications pertains to high-surface area reaction test-vehicles for food and drug evaluation.

BACKGROUND

Crystalline silicon (including multi- and mono-crystalline silicon) is the most dominant absorber material for commercial solar photovoltaic (PV) applications, currently accounting for well over 80% of the solar PV market. There are different known methods of forming monocrystalline silicon film and releasing or transferring the grown semiconductor (e.g., monocrystalline silicon) layer. Regardless of the methods, a low cost epitaxial silicon deposition process accompanied by a high-volume, production-worthy low cost method of release layer formation are prerequisites for wider use of silicon solar cells.

Porous silicon (PS) formation is a fairly new field with an expanding application landscape. Porous silicon is created by the electrochemical etching of silicon wafers with appropriate doping in an electrolyte bath. The electrolyte for porous silicon is, for example: HF (49% in $H_2O$ typically), isopropyl alcohol (IPA) (and/or acetic acid), and deionized water (DI $H_2O$). IPA (and/or acetic acid) serves as a surfactant and assists in the uniform creation of PS. Additional additives such as certain salts may be used to enhance the electrical conductivity of the electrolyte, thus reducing its heating and power consumption through ohmic losses.

Porous silicon has been used as a sacrificial layer in MEMS and related applications where there is a much higher tolerance for cost per unit area of the wafer and resulting product than solar PV. Typically porous silicon is produced on simpler and smaller single-wafer electrochemical process chambers with relatively low throughputs on smaller wafer footprints. Currently there is no commercially available porous silicon equipment that allows for a high throughput, cost effective porous silicon manufacturing. The viability of this technology in solar PV applications hinges on the ability to industrialize the process to large scale (at much lower cost), requiring development of very low cost-of-ownership, high-productivity porous silicon manufacturing equipment.

SUMMARY

The present disclosure includes several embodiments for the batch processing of semiconductor (silicon in some embodiments) wafers to produce layers of porous semiconductor. Options for processing wafers of different shapes are presented, as well as different geometries advantageous for removing reaction gases, minimizing current leakage, and allowing for efficient wafer handling.

BRIEF DESCRIPTION OF THE DRAWINGS

The features, nature, and advantages of the disclosed subject matter will become more apparent from the detailed description set forth below when taken in conjunction with the drawings, in which like reference numerals indicate like features and wherein:

FIG. 3A shows a chamber design for square wafers;

FIG. 3B shows a tilted chamber design for square wafers;

FIG. 4 shows a chamber design for round wafers;

FIG. 5 shows two designs for wafer clamps;

DETAILED DESCRIPTION

Although the present disclosure is described with reference to specific embodiments, one skilled in the art could apply the principles discussed herein to other areas and/or embodiments without undue experimentation.

Figure 1:
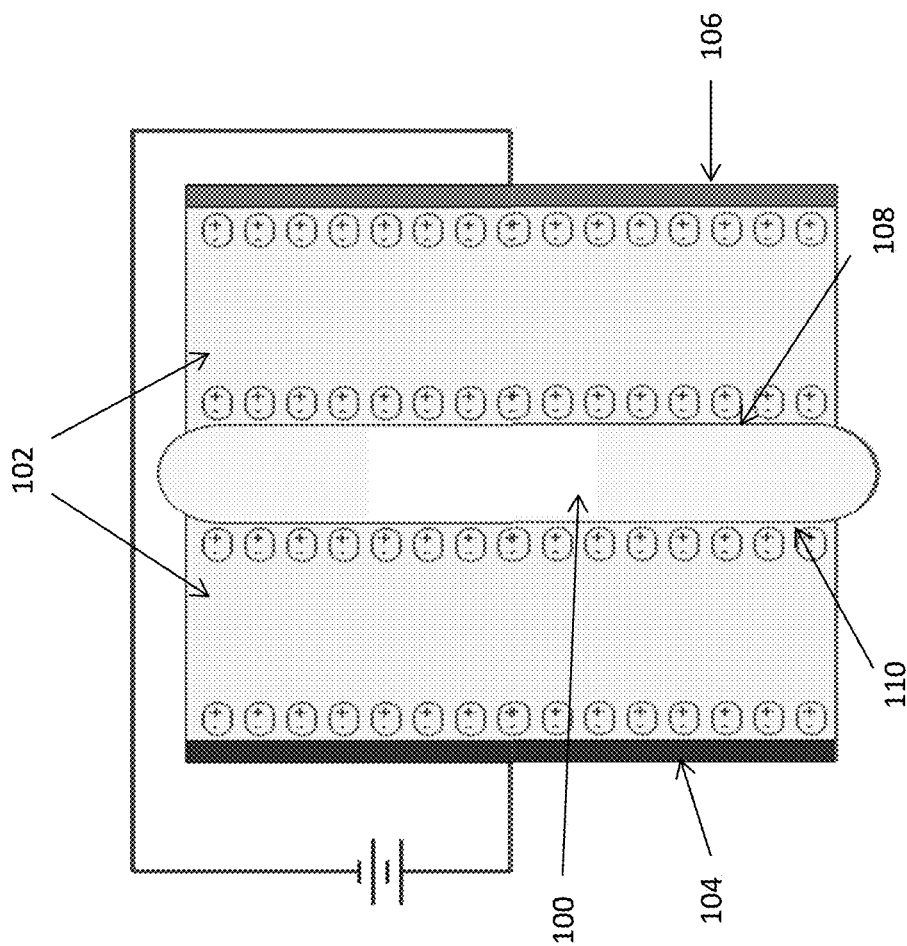
FIG. 1 shows a prior-art single-wafer porous silicon electrolytic bath arrangement.

One novel aspect in the porous silicon system designs and processing methods of this disclosure lies in the batch parallel or multi-wafer processing architecture (batch stack architecture), similar to low-cost large batch wet chemical processing in benches or tanks. Presently available porous silicon tools rely on single wafer processing which characteristically burdens each wafer with high capital cost, serial cumulative processing times, relatively high electrical power consumption per wafer, and excessive wafer handling/sealing resulting in potential yield losses. The novel designs of this disclosure may reduce the capital cost by a factor approximately equal to or even greater than the number of wafers in each batch stack or array. Furthermore, the proposed design simplifies and reduces the capital cost of automation, reduces the tool footprint and enables downstream rinsing and drying. FIG. 1 shows a very basic diagram of a single wafer porous silicon electrolytic bath arrangement (prior art). Wafer 100 is placed in electrolyte bath 102, between anode 104 and cathode 106. In one embodiment, electrolyte bath 102 may be HF/IPA. A porous silicon film is created on wafer frontside 108 as current is passed through the system; no porous silicon is formed on wafer backside 110. As current runs through the system, hydrogen gas may be evolved at cathode 106 and wafer backside 110; oxygen gas may be evolved at anode 104 and wafer frontside 108.

Figure 2:
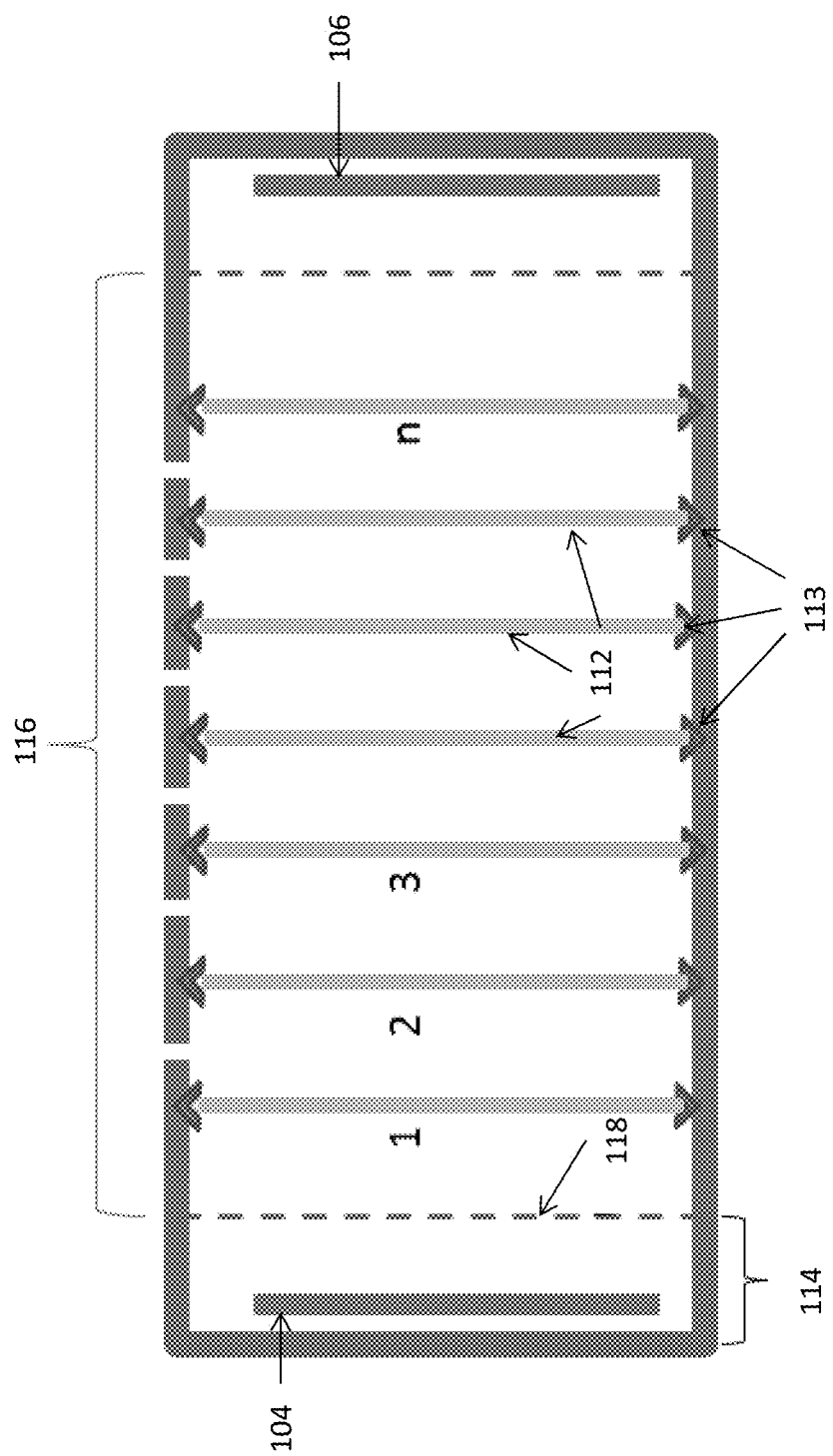
FIG. 2 shows an n-batch stack series array porous silicon electrolytic bath arrangement.

FIG. 2 reveals the basic form of the "n" batch stack series array (which is an embodiment of this disclosure). In this arrangement wafers 112 are stacked substantially parallel with respect to one another and may be oriented vertically (or alternatively horizontally or in other orientations) with the electrode assembly on either end of the batch reactor or bath. Wafers 112 are held in place by wafer clamps 113. The number of wafers can be increased from 1 to n (with n being a minimum of 2 and a maximum at least in the tens of wafers) and large number of wafers can be stacked just by increasing the length of the reactor. The maximum value of "n" is based on the acceptable size of the batch reactor for the optimal tool foot print, chemical utilization, required electric power for "n" wafers, etc. Processing multiple wafers plays nicely into cost-of-ownership (CoO) reduction. The key advantages of this batch design are the ability to share the chemical electrolyte bath, use a single pair of electrodes and reduce overall materials/components required in this multi-wafer scheme.

The details about the individual components of the batch reactor are explained below.

Electrode Assembly/Electrode Chamber

The embodiment includes multiple architecture of the electrode assembly. The simple version is a solid electrode plate or a film etc. The inert electrode, such as diamond, graphite, platinum, or any other suitable material, does not corrode or etch during the electrochemical reaction. The second embodiment of the electrode assembly is a compartmentalized electrode chamber as shown in FIG. 2. In this case, electrode chambers 114 are separated from reaction chamber 116, which holds the actual process electrolyte and the wafers. The electrode chamber is separated from the process chamber by the means of conducting membrane 118 (allows electric field to pass through but prevents the transfer of chemical ions and molecules). The membrane can be self-standing or be sandwiched by perforated non conducting plates to provide mechanical stability. This separation or compartmentalization allows for the use of different electrolyte chemicals (various compositions, chemical components, etc.) in the electrode chambers and the process chambers without interfering with each other.

Process Chamber

The process chamber holds the wafers and the electrolyte. The embodiment covers a wide range of process chamber dimensions to be able to create porous silicon on wafers of various geometries such as, but not limited to, round, square, pseudo square (square with truncated corners) with rounder corners of varying degrees, as well as rectangular structures. Schematics of a 200 mm round and 165 mm square process chambers are shown in FIGS. 3A, 3B, and 4. Each of those figures shows side view 200, closed sectional view 202, and open sectional view 204.

The substrates involved may be essentially flat with varying degree of roughness or may be structured to form 3-dimensional patterns or structured with films that locally inhibit or enable porous silicon formation.

The process chambers are envisioned to be able to open in multiple sections, like a clam shell as shown in FIGS. 3A, 3B, and 4. This allows easy loading of a batch of wafers (n wafers at a time) when the upper portions of the chamber walls are open. Once the wafers are secured in the lower portion of the chamber, the sides and top portion of the chamber close/latch around the wafers. This creates a hermetic seal between the chamber wall and each individual wafer. This is extremely critical as the electric field from the electrodes on either end of the process chamber is required to pass through the wafers to form relatively uniform and repeatable porous silicon layers. The chamber of the square wafer can be installed with a wide variety of tilt from 0 degrees (as shown in FIG. 3A) to 45 degrees (as shown in FIG. 3B). The wide range of tilt or wafer orientation allows for the choice of optimal chemical flow and gas escape during the anodization process.

Wafer Holders and Seal

A key requirement of the porous silicon process is to get substantially uniform porous silicon coverage on the full surface of the wafer, in some embodiments without any edge exclusions. This requires that no areas of wafer edge should be blocked or covered by any material that will prevent uniform electric field distribution and direct contact with the chemistry. One embodiment covers designs of mechanical features that can hold the wafer in place, but with zero to negligible contact points and blocking points on the wafer. As shown in FIG. 2, a simple clamp type wafer holder may be used to enable this capability. An enlarged image of the wafer holder is shown in FIG. 5. Wafer clamp 206 lacks this desirable property, preventing the formation of PS around the edge of the wafer.

Another critical item is the choice of sealing material around the inner walls of the process chamber. The chamber walls will be lined with either a single layer of chemically inert (HF and organic resistant) insulating rubber or foam to provide a leak-free seal between the wafer edge and the chamber wall or the wafer holders. This is critical to prevent any chemical leak or electric field leakage in areas where the clam shell chamber walls lock.

Electric Field Optimization

The batch chamber design with the compartmentalized electrode chamber allows for electric modulation as well. The parameters such as electrode dimension, gap between electrode and closest wafer, gap from wafer to wafer, etc. can easily be modified to achieve the required uniformity for the electric field. Another key component is the spacers used to hold the membrane discussed above. The shape and patterns on the insulating spacer can also be modified to achieve the best electric field uniformity on the wafer. In circumstances where a varying electric field (thereby varying thickness or porosity of porous silicon) is required for the integrated process flow, the spacer design can be used to control the required electric field without changing the chamber design.

Fluid Flow and Hydrogen Vent

Figure 6:
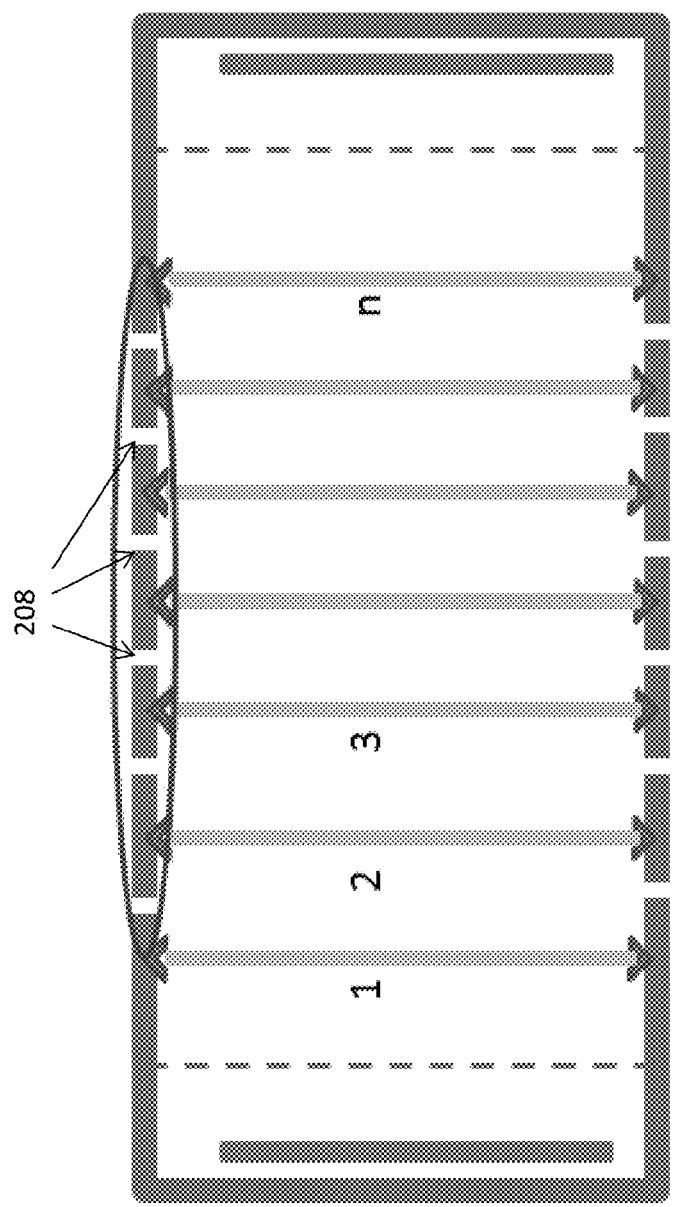
FIG. 6 shows a chamber design with fluid fill and vent ports.

The chamber may be designed with fluid fill and vent ports 208 on the top of the chamber as shown in FIG. 6. As shown, this embodiment also includes designs of fluid inlet and outlet ports at other locations of the chamber to achieve the best electrolyte replenishment to the wafer (to minimize the impact of reaction byproducts) and maintain a consistent chemical concentration.

One challenge with any porous silicon chamber is handling the hydrogen ($H_2$) gas generated as a result of the anodic etch reaction. Hydrogen evolves from the surface of the wafer and each electrode. Since the bath is integral with electrical current transmission, $H_2$ gas blocks current flow and supply of chemicals to the reaction surface, thus affecting porous silicon formation and continuity/uniformity. It is therefore critical to effectively and rapidly purge or sweep $H_2$ byproducts from the surfaces of the wafer and electrodes. The wafer gap, fluid flow and design of the flow ports determine the effectiveness of the sweep. While sweeping $H_2$ is fairly simple in terms of fluid mechanics, some consideration is warranted to mitigate the current loss from the fluid ports. Since the fluid lines are connected from wafer to wafer, depending on the geometry of the ports, line size and length, current can leak or bypass each wafer. Therefore, isolation of each port is advantageous. Also, for example, reducing the line diameter and increasing the length results in greater electrical resistance which reduces current losses or bypass losses. The current field lines are also influenced by the geometry adjacent to the wafer. So, large flow ports are less desirable compared to multiple small ports.

Bath in Bath Design

Figure 7A:
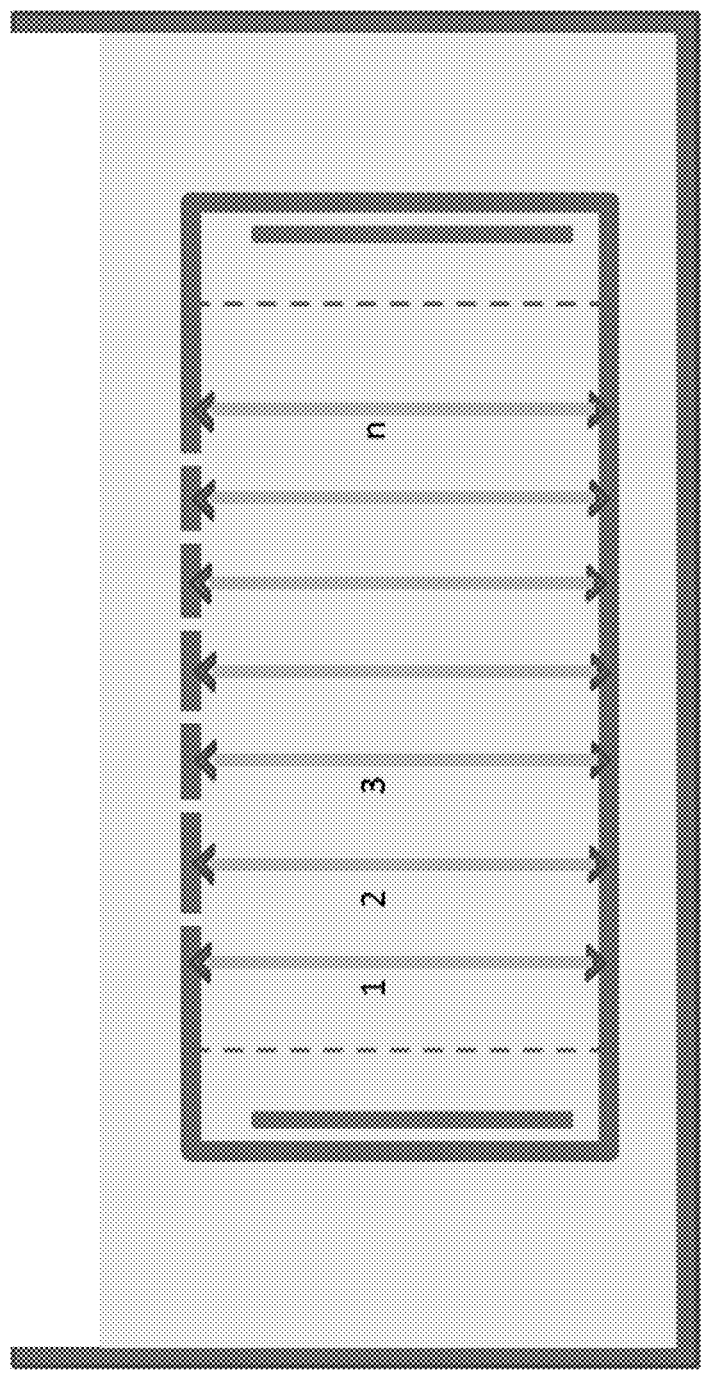
FIG. 7A shows a bath-in-bath chamber design.
Figure 7B:
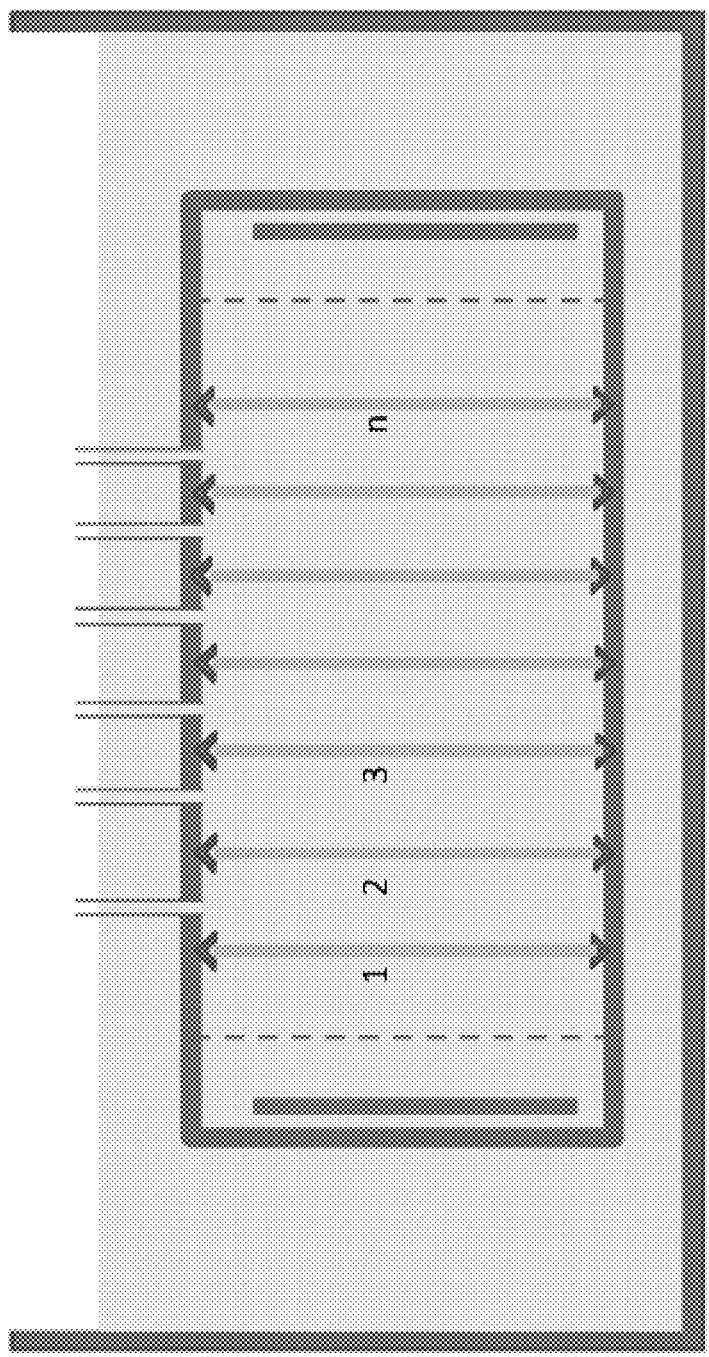
FIG. 7B shows another embodiment of a bath-in-bath chamber design.

Typical wet chemical baths and process chambers use direct fluid fill/drain of the process chamber, wherein the chemical is directly pumped in the process chamber. This may require additional fill and drain times before the process can start and results in loss of productivity. This embodiment also covers a new design termed as "bath in bath" for the PS production as shown in FIGS. 7A and 7B.

There are at least two embodiments of this bath in bath design:

a) Prefilled inner chamber that is immersed and lifted out completely into and from the bath; and, b) Resident bath-in-bath with wafers being handled using auto loader that handles a batch of wafers and that places the batch into the lower holder part of the inside bath, then retreats.

In design a) the process chamber is pre-loaded with wafers and filled with the process chemicals. The entire assembly is then immersed into a larger bath which is pre-filled with the process chemical/electrolyte. The ports/vents on the top of the chamber allow for the electrolyte to fill the process chamber if and when the liquid level drops in the process chamber due to the reaction or other means of loss such as evaporation. Once the process is complete, the process chamber unlocks and is pulled out and the standby process chamber is immediately immersed in the larger bath minimizing loss in productivity due to wafer load/unload and chamber fill and drain. The larger bath is designed with its own pumping and recirculation system to maintain the required concentration and temperature. This methodology allows having multiple process chambers that can be introduced into the main bath without any loss in productivity.

In design b) the chamber is an integral part of the tool or the larger bath and always remains immersed in the main bath, but the chamber can open and close. It is envisioned that loading mechanisms such as robotic handlers can transfer a batch of n wafers into the base of the process chamber. After the wafer handlers have moved away from the process chamber, the outer walls of the process chamber close. This action not only secures the wafers, but also encloses the process chemicals in to the process chamber. The additional vents and ports allow the process chamber to be filled completely to the required level and maintain the same level throughout the process.

In any case, the top of the vent ports may be outside of the liquid, such that an electrically connecting path outside of the inner bath is avoided. This embodiment is shown in FIG. 7B.

The embodiments of design a) and design b) can be combined into a hybrid utilizing the loading mechanism from design a) and the sealing mechanism from design b). In this hybrid design, the bottom section of the chamber remains in the outer bath. The wafers are pre-loaded into the top (and side) portion of the chamber, which acts both as a handling mechanism and a partial chamber. The preloaded wafers are then immersed in the outer bath until the wafers make contact with the lower portion of the chamber. The chamber walls are then closed tight with an actuator mechanism ensuring a leak-proof chamber.

The batch porous silicon equipment design embodiments described above can be used to form either single-layer or multi-layer porous silicon on one or both sides of the wafers in the batch. Porous silicon can be formed on only one side of the wafers by applying the electrical current flowing in only one direction without a change in the current polarity. On the other hand, porous silicon can be formed on both sides of the wafers by alternating the current flow direction at least once or multiple times. The electrical current density (in conjunction with the HF concentration) controls the layer porosity. Thus, the layer porosity can be increased by increasing the electrical current density and conversely can be reduced by reducing the electrical current density. Multi-layer porous silicon can be formed by modulating or changing the electrical current level in time during the porous silicon formation process. For instance, starting the porous silicon process with a lower current density followed by a higher current density results in formation of a lower porosity layer on top of a higher porosity buried layer. A graded porosity porous silicon layer can be formed by, for instance, linearly modulating or varying the electrical current density in time. One can use this approach to form any porous silicon structure with one to many porous silicon layers with one to many porosity values.

Those with ordinary skill in the art will recognize that the disclosed embodiments have relevance to a wide variety of areas in addition to those specific examples described above.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

It is intended that all such additional systems, methods, features, and advantages that are included within this description be within the scope of the claims.

What is claimed is:

1. A bath-in-bath batch processing apparatus for producing porous semiconductor on a plurality of semiconductor wafers, comprising:

an electrolyte-filled outer housing;

an electrolyte-filled inner housing removable from said outer housing, said inner housing operable to open and close, and forming a seal when closed;

an anode disposed at a first end of said inner housing;

a cathode disposed at an opposite end of said inner housing, said anode and said cathode coupled to electrical circuitry capable of providing an electrical power comprising electrical voltage and current;

a plurality of semiconductor wafers arranged between said anode and said cathode, wherein each said wafer is held in place by a peripheral wafer clamp disposed around a periphery of said wafer, said peripheral wafer clamp allowing substantially all of a front and a back surface of each said wafer exposure to said electrolyte;

a plurality of vent ports in said inner housing for allowing evolved hydrogen gas to escape, said vent ports extending beyond a surface of said electrolyte to prevent current leakage through said vent ports; and a plurality of fluid fill ports in said inner housing for replenishing said electrolyte and sweeping said hydrogen gas away from said plurality of wafers.

2. The apparatus of claim 1, further comprising a conductive anode membrane separating said anode from said plurality of semiconductor wafers.

3. The apparatus of claim 1, further comprising a conductive cathode membrane separating said cathode from said plurality of semiconductor wafers.

4. The apparatus of claim 1, wherein said electrical circuitry is operable to produce a graded porosity layer of porous semiconductor comprising at least two different porosities on said plurality of semiconductor wafers.

5. The apparatus of claim 4, wherein said graded porosity layer comprises a higher porosity in depth compared to a lower porosity on the surface.

6. The apparatus of claim 1, wherein said electrical circuitry is operable to produce a multilayer of porous semiconductor on said plurality of semiconductor wafers, said multilayer comprising discrete layers of porous semiconductor having at least two different porosities.

7. The apparatus of claim 6, wherein said multilayer comprises a buried porous semiconductor layer with a higher porosity value and a surface porous semiconductor layer with a lower porosity value.

8. The apparatus of claim 1, wherein said electrical circuitry is operable to produce a porous semiconductor layer on both sides of each of said plurality of semiconductor wafers by switching a voltage polarity and current direction during the porous semiconductor formation process.

9. The apparatus of claim 1, wherein said semiconductor wafers are crystalline silicon wafers and said porous semiconductor is porous silicon.

10. The apparatus of claim 1, further comprising a loading and unloading mechanism for transferring said inner housing into and out of said outer housing.

11. The apparatus of claim 1, further comprising a loading and unloading mechanism for transferring batches of said semiconductor wafers into and out of said inner housing.

12. The apparatus of claim 1, wherein said semiconductor wafers are circular shaped.

13. The apparatus of claim 1, wherein said semiconductor wafers are square shaped.

14. The apparatus of claim 1, wherein said semiconductor wafers are crystalline silicon wafers.

15. The apparatus of claim 1, wherein said inner housing is configured to open in multiple sections.

* * * * *